United States Patent [19]
Chia et al.

[11] Patent Number: 5,933,710
[45] Date of Patent: Aug. 3, 1999

[54] METHOD OF PROVIDING ELECTRICAL CONNECTION BETWEEN AN INTEGRATED CIRCUIT DIE AND A PRINTED CIRCUIT BOARD

[75] Inventors: Chok J. Chia, Campbell; Patrick Variot, San Jose, both of Calif.

[73] Assignee: LSI Logic Corporation, Milpitas, Calif.

[21] Appl. No.: 08/910,608

[22] Filed: Aug. 13, 1997

Related U.S. Application Data

[62] Division of application No. 08/725,735, Oct. 4, 1996, Pat. No. 5,789,811, which is a continuation of application No. 08/187,238, Jan. 25, 1994, Pat. No. 5,563,446.

[51] Int. Cl.⁶ .......... H01L 21/44; H01L 23/495; H01L 23/48; B23K 31/02
[52] U.S. Cl. .......... 438/123; 438/108; 438/124; 438/613; 257/666; 257/693; 257/737; 257/738; 228/180.22
[58] Field of Search .......... 438/612, 597, 438/618, 613, 108, 123, 124, FOR 371, FOR 375, FOR 378; 257/737, 693, 666, 738, 778, 787; 228/180.22

[56] References Cited

U.S. PATENT DOCUMENTS

| | | | |
|---|---|---|---|
| 4,530,002 | 7/1985 | Kanai | 257/693 |
| 4,853,757 | 8/1989 | Kuramitsu et al. | 357/45 |
| 4,942,454 | 7/1990 | Mori et al. | 357/70 |
| 5,040,035 | 8/1991 | Gabara et al. | 357/23.4 |
| 5,157,480 | 10/1992 | McShane et al. | 174/52.4 |
| 5,239,198 | 8/1993 | Lin et al. | 257/693 |
| 5,355,016 | 10/1994 | Swirbel et al. | 257/659 |
| 5,355,283 | 10/1994 | Marrs et al. | 361/760 |
| 5,563,446 | 10/1996 | Chia et al. | 257/704 |

FOREIGN PATENT DOCUMENTS

| | | |
|---|---|---|
| 61-198650 | 9/1986 | Japan . |
| 2-87550 | 3/1990 | Japan . |

*Primary Examiner*—Olik Chaudhuri
*Assistant Examiner*—Alonzo Chambliss

[57] ABSTRACT

A surface mounted integrated circuit die package includes a group of peripheral leads extending laterally outwardly from the perimeter of the package and also includes an array of solder balls on the bottom of the package. The arrangement provides for a greater number of input/output connections to a die package by utilizing both peripheral leads and a ball grid array without requiring increases in package size or a reduction in the width of electrically conductive interconnections.

15 Claims, 2 Drawing Sheets

5,933,710

METHOD OF PROVIDING ELECTRICAL CONNECTION BETWEEN AN INTEGRATED CIRCUIT DIE AND A PRINTED CIRCUIT BOARD

This is a divisional of application Ser. No. 08/725,735, filed on Oct. 4, 1996, now U.S. Pat. No. 5,789,811 issued on Aug. 4, 1998, which is a continuation of application Ser. No. 08/187,238 filed on Jan. 25, 1994, and which issued as U.S. Pat. No. 5,563,446 on Oct. 8, 1996.

FIELD OF THE INVENTION

The present invention relates to integrated circuit die packages and more particularly concerns an arrangement for increasing the number of input/output connections to the package.

BACKGROUND OF THE INVENTION

Surface mount packages for integrated circuit dies typically include input/output connections for electrically coupling the packaged integrated circuit die to external. components. One type of conventional package includes input/output. (I/O) terminals in the form of peripheral leads extending laterally outward from peripheral edges of the package. Another type of package uses an array of solder balls on the bottom of the package. As technology progresses, integrated circuit dies are being manufactured with an ever increasing number of transistors or monolithic devices performing an ever increasing number of functions, and accordingly require an increasing number of input/output connections.

Peripheral leaded packages, however, are limited in the number of leads or input/output terminals that can be provided by the physical size of the package and the pitch or separation of the leads. For example, a 28 mil.×28 mil. package with a lead pitch of 0.5 mil typically has 208 leads. In order to increase the number of leads, a larger package can be used or the pitch of the leads can be reduced. For example, a 40 mil.×40 mil. package with a lead pitch of 0.4 mil. would have 376 leads.

Ball grid (BGA) packages have solder balls arrayed on the bottom of the package. To increase the number of solder balls the package size must be increased and/or the separation of balls or array pitch can be reduced. For example, a 25 mil.×25 mil. sized package with balls pitched at 60 mil. can have 225 balls, whereas a 40 mil.×40 mil. package with balls pitched at 50 mil. may have up to 961 balls.

However, it is frequently not desirable, and often impossible, to simply increase the package size or to decrease I/O terminal pitch. For peripheral leaded packages, increasing the package size results in a package that occupies more of the circuit board space, thus increasing costs. Reducing the lead pitch results in a lead of smaller dimensions which is more readily damaged in manufacturing. Additionally, smaller separation between leads is more likely to result in a shorting between leads in a surface mounted arrangement.

In a similar manner, for the ball grid array package a reduction in ball pitch can result in increased yield loss and increased costs of the printed circuit board. The printed circuit board cost increases because the finer pitch requires larger numbers of layers in the printed circuit board for routing connections to the balls, whereas increasing the size of the package increases the area occupied by the package on the printed circuit board, thus increasing the costs.

Accordingly, it is an object of the present invention to provide a surface mounted integrated circuit die package that avoids or minimizes the above mentioned problems.

SUMMARY OF THE INVENTION

In carrying out principles of the present invention in accordance with a preferred embodiment thereof a surface mounted integrated circuit die package is formed with a die having plurality of die contact pads and a die package at least partly enclosing the die and die contact pads. A plurality of peripheral leads extend laterally outwardly of the die package and are electrically connected to the die pads. In addition, an array of solder balls is mounted on the bottom of the die package and electrically connected to the die pads. The peripheral leads are bent downwardly in one arrangement so that these leads have terminal portions in a common plane with the solder balls. The leads and balls form a planar array of lead terminals and solder ball terminals. Thus, a significant increase in the number of input/output connections is provided for the surface mounted die package without either increasing package dimensions or increasing pitch of the input/output terminals.

DESCRIPTION OF THE PREFERRED EMBODIMENTS

Figure 1:
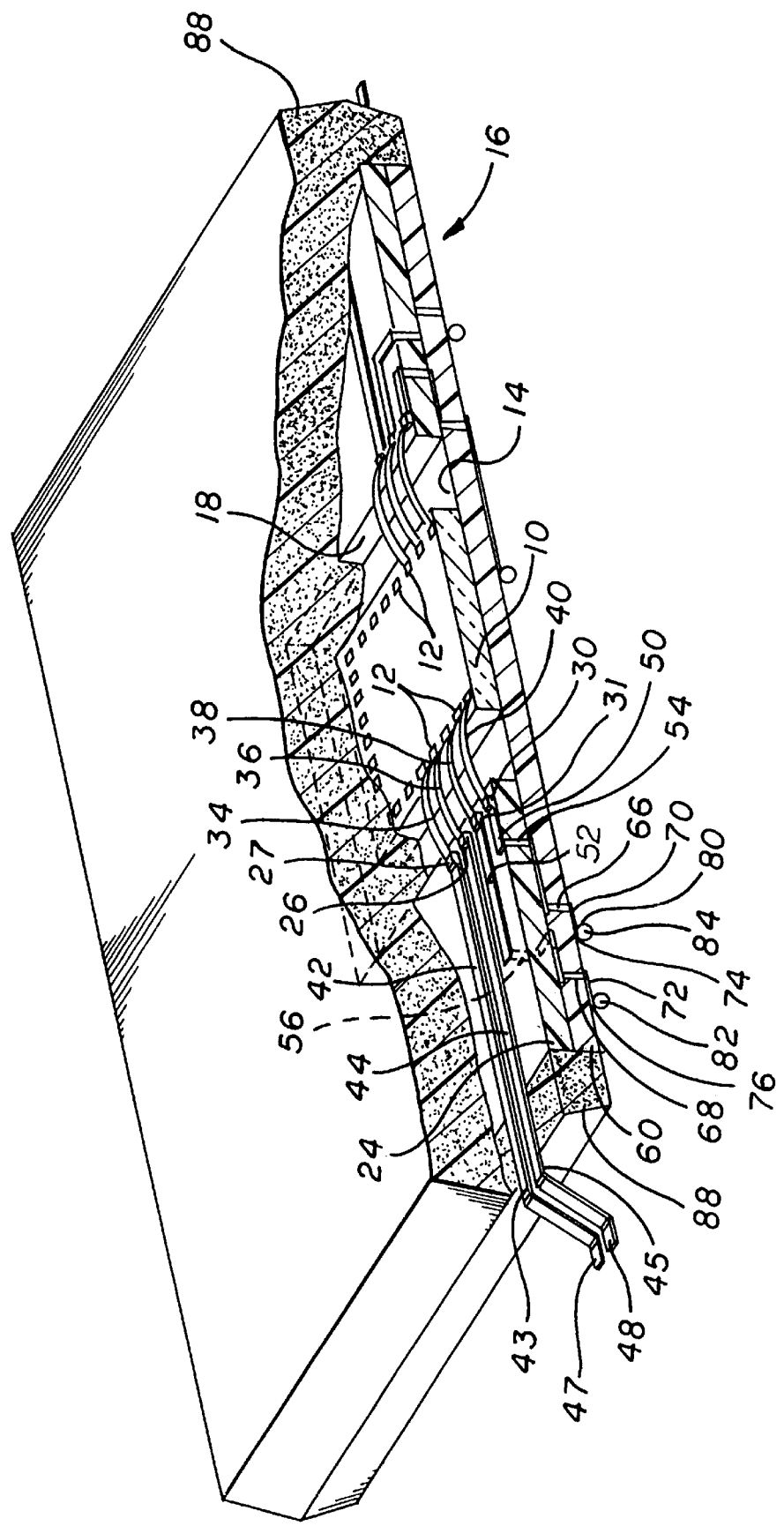
FIG. 1 is a breakaway pictorial illustration of an integrated circuit die package embodying principles of the present invention.

As shown in FIG. 1, a quad flat pack package includes an integrated circuit die 10 having a plurality of die contact pads 12 mounted on one surface thereof. The die is bonded or otherwise secured to an upper surface 14 of a multi-layer dielectric substrate 16. The substrate includes a central or. inner section of reduced thickness forming a cavity in which the die is mounted. The cavity is defined by cavity walls 18. The multi-layer substrate 16 is formed of dielectric layers of a nonconductive material such as a Kapton polyimide or PCV, for example, each having formed thereon a pattern of conductive traces and contact pads. For example, an uppermost layer 24 of the substrate 16 may be formed with a plurality of bonding pads, such as pads 26,27 and pads 30,31. Pads 26,27 are wire bonded to associated die pads 12 by wires 34,36. Substrate pads 30,31 are also bonded to other pads of the die pads by bonding wires 38,40. Some of the bonding pads of the substrates, such as pads 26,27, are connected to conductive leads 42,44 mounted on the upper surface of upper layer 24 of the substrate, with end portions 43,45 extending laterally outwardly from the periphery of the substrate. Free ends of the leads 43,45 are bent into an illustrated generally Z-shaped configuration to provide terminal points 47,48, which may be bonded to conductive pads on an electrical component such as a printed circuit board (not shown in FIG. 1) upon which the package is to be surface mounted.

Pads 30,31 on the upper surface of upper layer 24 of the substrate are connected by traces 50,52 on the upper surface of the upper substrate layer 24, by vias 54,56 which extend through the upper surface to a second or lower layer 60 of the substrate, and thence through additional traces on the lower substrate 60, and further vias 66,68 to traces 70,72 and ball contact pads 74,76 formed on the lower surface of lower layer 60 of the substrate. A plurality of solder balls 80,82 are secured to the ball pads 74,76 to form a ball grid array having lowermost terminal points, such as points 84, that are adapted to contact pads on the printed circuit board (not shown in FIG. 1) upon which the package is to be surface mounted. All of the terminal points 84 of the solder balls and the terminal points 47,48 of the peripheral leads preferably lie in a common plane so that when the package is positioned upon, for example, the upper surface of a printed circuit board having a pattern of contacts that matches the pattern of the terminal points 47,48, 84, etc. The terminal points for the package are thus in contact with, and readily electrically connected to bond to the pads on the printed circuit board itself. This latter electrical connection may be performed, for example, by reflowing solder operations. That is, those familiar with reflow solder operations will know that these operations reflow the solder balls 80, 82 (recalling that these solder balls are fusible, and are softened during the reflow operation) so that the contact points 84 of these solder balls conform to the contact pads of the printed circuit board. Moreover, while the contact points 84 are preferably in a common plane before the reflow solder operation, this in not necessarily the case in a strict sense. In fact, the solder balls 80, 82 may not all be precisely of a common diameter, so that the contact points 84 may be out of co-planarity for this as well as other reasons before the solder reflow operation. Also, the contact pads of the printed circuit board may not be strictly in a common plane. For example, the printed circuit board may be slightly warped, so that the contact pads on this printed circuit board are not perfectly co-planar for this as well as other possible reasons. However, during the reflow solder operation the solder balls 80, 82 will soften and deform slightly to compensate both for lack of perfect co-planar alignment of the points 84 and of the contact pads on the printed circuit board. After the reflow solder operation, all of the solder balls 80, 82, at their contact points 84, will contact and conform to interface electrically with the contact pads of the printed circuit board. Also, it must be recognized that the end portions 43, 45 of leads 42, 44 are somewhat flexible. Thus, these leads 42, 44 will (if necessary) flex slightly at end portions 43, 45 during the solder reflow operation to allow terminal points 47, 48 to also contact and be solder bonded to the contact pads of the printed circuit board. This is true even if the terminal points 47, 48 are initially not of perfect co-planarity with the points 84.

It should be understood that only a few exemplary substrate pads, wire bonds and traces and a few of the peripheral leads and balls of the solder ball array are shown in FIG. 1 in order to maintain the clarity of the drawing. There are a sufficient number of wire bonds, wire bond pads and peripheral leads and a sufficient number of additional substrate pads, traces, vias and solder balls so that all die pads may be individually connected to a given individual input/output terminal, by as one of the peripheral leads or one of the solder balls. The ball grid array may extend over nearly all of the bottom of the package and the peripheral leads may extend outwardly from one, two, three or all four sides of the package, as deemed necessary or desirable. A plastic body 88 is secured to the multi-layer substrate, as by transfer molding for example, to provide protection of the die, the bonding wires and the traces on the upper surface of the substrate.

By providing a combination of peripheral leads projecting outwardly from the periphery of the package and an array of solder balls mounted on the bottom of the package, a greatly increased number of input/output terminals may be provided to the die without either increasing package dimensions or increasing pitch of peripheral leads or solder balls. It will be understood that the traces, substrate pads and other electrical connections can be arranged in any suitable desired configuration and pattern and that the substrate 16 may be formed with one, two or more layers depending upon the nature and complexity of the pattern of die pads to be provided with input/output termini. The number of peripheral leads may be greater than, less than or equal to the number of solder balls as desired for a given design.

Figure 2:
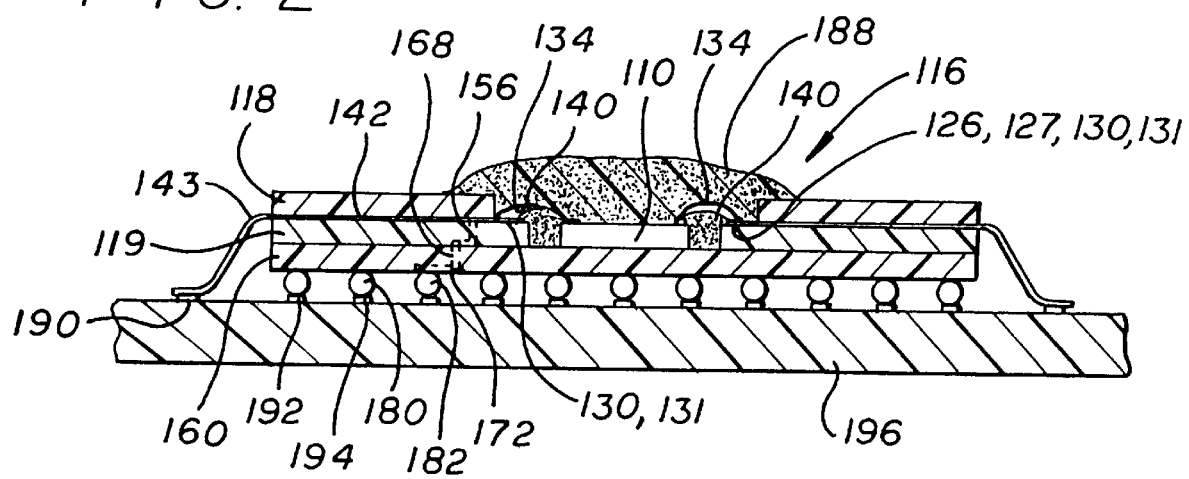
FIG. 2 is a sectional view of an alternate arrangement of surface mount package including a potting plastic to protect the die.
Figure 3:
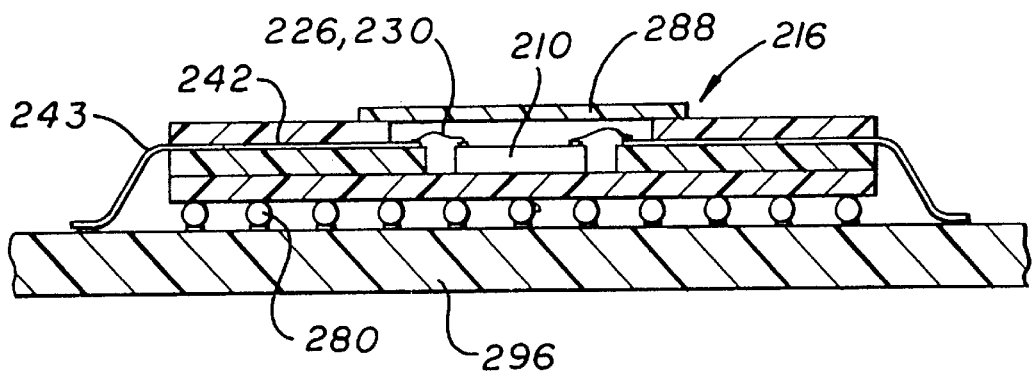
FIG. 3 illustrates a cavity style package embodying the principles of the present invention.
Figure 4:
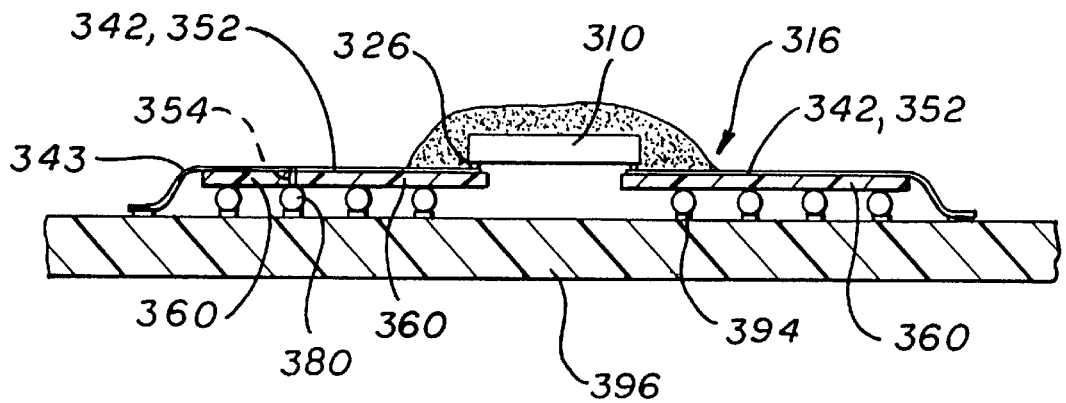
FIG. 4 shows a TAB package embodying the principles of the present invention.

Illustrated in FIG. 2 is a slightly different type of integrated circuit die package also embodying a combination of peripheral leads and an array of solder balls. In FIGS. 2, 3 and 4, which show different types of die packages incorporating both peripheral leads and solder ball arrays, similar components are designated by similar numerals, changing only the prefix numeral, so that similar components may be readily identified. Thus, for example, FIG. 2 illustrates a die 110 corresponding to the die 10 of FIG. 1 mounted in a cavity formed in a substrate 116 corresponding to substrate 16 of FIG. 1. The substrate 116 of FIG. 2 includes several layers, including an upper layer 118, an intermediate layer 119 and a lower layer 160, with pads 126,127 on the upper surface of layer 119 connected to traces 142 by wire bonds 134. Some of traces 142 are connected to peripheral leads 143. Pads 130,131 on the upper surface of layer 119 further are connected by wire bonds 140 and leads and vias 156, 168,172 extending internally of the multi-layer substrate to solder balls 180 mounted to the bottom of the lowermost layer of the substrate. These internal leads and vias are provided for connection to each of the solder ball terminals but are shown only for ball 182 for clarity of the drawing. A plastic potting body 188 may be poured in place over the substrate cavity in which the die is mounted to protect the die and its wire bond leads 126,127,130,131.

As described in connection with the arrangement of FIG. 1, the terminal points of the peripheral leads and of the balls of the solder ball array are all mutually co-planar and are formed in a pattern that conforms to a pattern of printed circuit board contact pads, such as pads 190,192,194, etc. which are carried on the upper surface of a printed circuit board 196 to which the package is to be surface mounted.

The arrangement illustrated in FIG. 3 comprises a cavity style package in which a die 210 is mounted on a multi-layer substrate 216 which carries a plurality of peripherals leads 242,243 and an array of solder balls 280. As in the prior embodiments, the die pads are wire bonded by wires 226, 230 to traces of the multi-layer substrate, some of which are connected to the peripheral leads 243 and others of which are connected through vias and traces (not shown in FIG. 3) within the multi-layer substrate to the solder balls 280. In this arrangement a lid 288 is secured to the uppermost surface of the multi-layer substrate 216 to enclose and seal the die 210 and its wire bond leads 226,230. In the arrangement of FIGS. 2 and 3 the peripheral leads 242,243, instead of extending on the uppermost surface of the multi-layer substrate, extend along an intermediate layer within the substrate and project outwardly from side edges of the substrate for connection to the circuit board 196,296 along with balls 180,280.

FIG. 4 illustrates a tape automated bonding (TAB) arrangement wherein a die 310 is connected to a flexible circuit tape frame 316 formed of a flexible dielectric substrate 360 on which are formed conductive traces 342,352. In the TAB package there are no wire bonding connections to the die pads. Instead the die pads, which are on the lower surface of the die as illustrated in FIG. 4, are connected to pads, such as pads 326 on the flexible circuit substrate 360. These pads 326 are connected to the traces 342,352 on the substrate. These traces have outer ends connected to the peripheral outwardly extending leads 343. A plurality of vias, such as vias 354, connect traces on the upper surface of the TAB substrate to solder pads on the lower surface of the TAB substrate, with an array of solder balls, such as balls 380, being connected to the solder pads on the lower surface of the TAB substrate. Thus the solder balls 380 and the ends of peripheral leads 343 all form a planar pattern of package terminals that will readily mate with the planar array of printed circuit board contacts 394 of a printed circuit board 396, to which they may be connected by bonding of the peripheral leads and reflow soldering of solder balls.

There have thus been described several different arrangements of surface mounted packages employing a combination of peripheral leads and an array of solder balls. The arrangements provide increased density of packages and also increase the number of available connections without changing the size of the package or the pitch of the leads or solder balls. Packages can thus be readily made and mounted by use of low cost methods so as to permit a substantial increase in the number of package connections at minimal expense.

In assembly of the several packages the die is attached to the upper surface of the substrate. Wire bonds or the TAB are then used to connect the die to the substrate, which is provided with pre-formed circuitry to connect the wire bond terminals to the solder grid array and to the peripheral leads. The package is then sealed, either by potting with epoxy, as in FIG. 2, by plastic molding, as in FIG. 1, or by the use of metallic or ceramic lids or other standard methods of protecting the die and wire as in FIG. 3. Thereafter the solder balls and leads are attached to the substrate pads for the ball array and peripheral leads and the completed package can be used and handled like a typical peripheral leaded package, such as the quad flat pack. The combination of both peripheral leads and an array of balls for connections more than doubles the number of available connections for a particular package. The arrangement also provides a much denser package, having a substantially larger number of connections that can be made for each package technology and allows for increasing density of the dies. The reduced size of the package for a particular number of connections also provides a cost reduction in the system manufacturing costs because less area of the printed circuit board is used by the component.

The combination of peripheral leads and solder balls does not require the development of a new method of surface mounting the package. The present invention may also be advantageously practiced with standard mounting technologies. The standard pitch of the leads and the relatively large pitch of the solder balls further allows for low cost printed circuit boards for the system and while still ensuring high assembly yields.

The solder balls and grid array on the bottom of the package, and particularly those in the central area more closely adjacent the die itself, can also be used to conduct to the printed circuit board and thus dissipate heat generated by the die. Thus packages embodying the present invention will have a heat capacity higher than conventional packages. Dissipation of heat generated by the die is an important factor in improving the reliability of a device and increasing the frequency of its operation.

By further permitting the use of existing mounting technology and manufacturing methods for manufacture of peripheral leaded and solder ball array packages of the present invention, the package will also have substantially similar reliability as is available from existing peripheral and ball grid array packages.

We claim:

1. A method of providing electrical connection between an integrated circuit die having a plurality of die electrical contact pads and a printed circuit board having a respective plurality of printed circuit board contact pads, said method including the steps of:

providing a die package substrate having a bottom surface and a periphery;

forming a plurality of electrical contact leads securing to said die package substrate and each extending outwardly of said package substrate from said periphery to cooperatively form a peripheral array of plural electrical contact leads spaced apart from one another;

providing a plurality of solder ball contact pads outwardly exposed on said bottom surface, and providing a respective plurality of solder balls each on one of said solder ball contact pads, providing each of said plurality of solder balls with a respective terminal point, and utilizing said plurality of solder balls to cooperatively define a solder ball contact array on said bottom surface of said substrate;

securing said integrated circuit die to said substrate;

providing a first plurality of individual electrical connection means each connecting only between a respective one of a first group of said plurality of die electrical contact pads and a respective one of said plurality of electrical contact leads;

providing a second plurality of individual electrical connection means each connecting only between a respective one of a second group of said plurality of die electrical contact pads and a respective one of said plurality of solder ball contact pads, said first group and said second group being mutually exclusive of one another; and providing individual electrical connection of each respective one of said plurality of printed circuit board contact pads either with a respective individual one of said plurality of electrical contact leads or with a respective individual one of said plurality of solder balls.

2. The method of claim 1 further including the steps of:

including a substrate in said package;

carrying on said substrate and including in said first plurality of individual electrical connection means a first plurality of conductive traces;

also carrying on said substrate and including in said second plurality of individual electrical connection means a second plurality of conductive traces; and including in said second plurality of individual electrical connection means plural conductive vias each extending through said substrate and each connecting one of said plurality of solder ball contacts to a trace of said second plurality of conductive traces and to an individual one of said plurality of die contact pads of said second group.

3. The method of claim 1 further including the steps of:

including a substrate in said package, and providing said substrate with a first side that forms said bottom surface of said package; and a second opposite side mounting said die on an inner portion of said second side of said substrate;

carrying said plurality of electrical contact leads on said second side of said substrate; and including in said first plurality of electrical connections a plurality of wire bonds each connected between a respective one of said plurality of electrical contact leads and a respective one of said die contact pads of said first group.

4. The method of claim 3 further including the step of using a potting material on said substrate to enclose said die and said plurality of wire bonds.

5. The method of claim 3 further including the steps of:

forming said substrate with an inner recessed portion;

mounting said die within said inner recessed portion;

including in said package a lid;

securing said lid to said substrate spanning over and closing said inner recessed portion; and using said substrate and lid in combination to enclose said die within said package.

6. The method of claim 1 further including the steps of:

including a substrate in said package;

providing said second plurality of electrical connections to include a plurality of conductive traces;

carrying said plurality of conductive traces on said substrate; and including in said plurality of electrical connections plural conductive vias each extending through said substrate and each connecting one of said plurality of solder ball contacts to a respective trace of said plurality of conductive traces.

7. The method of claim 1 further including the steps of:

forming said substrate with a first side that forms said bottom surface of said package and a second opposite side;

mounting said die on said second opposite second side of said substrate;

carrying said plurality of electrical contact leads on said opposite second side of said substrate;

forming said first plurality of electrical connections to include said plurality of electrical contact leads each extending toward but short of said die to terminate in a respective one of a plurality of wire bond pads spaced from said die; and providing as part of said plurality of electrical contact leads a plurality of wire bonds each connecting between a respective one of said plurality of wire bond pads terminating said plurality of electrical contacts leads and a respective one of said die contact pads of said first group.

8. A method of providing electrical connection between an integrated circuit die having a plurality of die electrical contact pads and a printed circuit board having a respective plurality of printed circuit board contact pads, said method comprising the steps of:

providing a die package substrate comprising at least one layer of substrate, each layer of substrate having a top side, a bottom side, and a periphery, and said die package substrate having a top surface defined by a top side of an uppermost layer of said at least one layer and a bottom surface defined by a bottom side of a lowermost layer of said at least one layer;

forming at least one layer of traces on said at least one layer of substrate;

positioning a plurality of solder ball contact pads on said bottom surface;

positioning a respective plurality of solder balls each on a respective one of said solder ball contact pads, each of said plurality of solder balls having a respective terminal point, said plurality of solder balls cooperatively defining a solder ball contact array on said bottom surface;

supporting said integrated circuit die on said at least one layer of substrate;

connecting individually said plurality of die electrical contact pads with an uppermost layer of said at least one layer of traces;

attaching a first group of a plurality of individual traces of an uppermost layer of said at least one layer of traces that extend outwardly from said periphery to said respective plurality of printed circuit board contact pads; and providing a means for connecting a second group of a plurality of individual traces that connects through said at least one layer of traces to a respective one of said plurality of solder ball contact pads, said first group and said second group being independent of one another such that electrical connections are made either through said first or said second group of said plurality of individual traces but not both.

9. The method of claim 8 further including the steps of:

said at least one layer of substrate including at least two layers of substrate comprising an uppermost layer and a lowermost layer of substrate, said at least two layers of substrate each having a periphery, and said bottom surface of said die package substrate defined by a bottom side of said lowermost layer of substrate;

said at least one layer of traces including a first and a second layer of traces on said bottom side and a top side, respectively, of said lowermost layer of substrate, and at least one layer of traces above said second layer of traces;

providing a plurality of vias which extends through each layer of said at least two layers of substrate to make individual connections between adjacent layers of traces of said at least one layer of traces; and positioning a plurality of solder balls contact pads on said bottom surface and connected to said first layer of traces.

10. The method of claim 9 further including the step of securing said integrated circuit die to said at least one layer of substrate layer that is below said uppermost layer.

11. The method of claim 8 further including the step of positioning said uppermost layer of substrate to protect said uppermost layer of traces.

12. The method of claim 8 further including the step of securing said integrated circuit die on said uppermost layer.

13. The method of claim 8 further including the step of providing a plurality of vias which extends through each layer of said at least one layer of substrate to make individual connections between adjacent layers of traces of said at least one layer of traces.

14. The method of claim 8 further including the step of connecting a plurality of wires to individually respective one of said plurality of die electrical contact pads with said uppermost layer of said at least one layer of traces.

15. The method of claim 8 further including the step of providing said integrated circuit die having said plurality of die electrical contact pads which are on a lower surface of said die and connecting directly individually respective to said uppermost layer of said at least one layer of traces.

* * * * *